US006537372B1

(12) United States Patent
Schupp

(10) Patent No.: US 6,537,372 B1
(45) Date of Patent: Mar. 25, 2003

(54) HEATER ARRANGEMENT FOR CRYSTAL GROWTH FURNACE

(75) Inventor: John D. Schupp, Kirtland, OH (US)

(73) Assignee: American Crystal Technologies, Inc., Mentor, OH (US)

(*) Notice: Subject to any disclaimer, the term of this patent is extended or adjusted under 35 U.S.C. 154(b) by 0 days.

(21) Appl. No.: 09/349,597

(22) Filed: Jul. 9, 1999

Related U.S. Application Data

(60) Provisional application No. 60/141,389, filed on Jun. 29, 1999.

(51) Int. Cl.[7] .............................................. C30B 35/00
(52) U.S. Cl. ..................................................... 117/200
(58) Field of Search .................................. 117/208, 200, 117/217, 273, 204; 373/94, 102, 117, 128; 219/424, 552; C30B 11/00, 11/02, 11/04, 29/12

(56) References Cited

U.S. PATENT DOCUMENTS

| 1,318,028 | A |   | 10/1919 | Thomson |   |
|---|---|---|---|---|---|
| 2,149,076 | A |   | 2/1939 | Stockbarger |   |
| 2,214,976 | A |   | 9/1940 | Stockbarger |   |
| 2,640,861 | A |   | 6/1953 | Kremers |   |
| 3,039,071 | A |   | 6/1962 | Ford |   |
| 3,649,366 | A |   | 3/1972 | Jordan et al. |   |
| 3,700,224 | A | * | 10/1972 | Nolting | 266/33 |
| 3,865,554 | A |   | 2/1975 | Wenckus et al. |   |
| 3,922,527 | A | * | 11/1975 | Witkin et al. | 219/494 |
| 3,961,905 | A |   | 6/1976 | Rice |   |
| 4,103,099 | A | * | 7/1978 | Allsopp | 13/7 |

(List continued on next page.)

FOREIGN PATENT DOCUMENTS

| DE | 250523 A1 | * | 10/1987 | ........... C03B/5/033 |
|---|---|---|---|---|
| EP | 0 869 203 A2 |   | 10/1998 |   |
| EP | 0 938 030 A1 |   | 8/1999 |   |
| EP | 0 939 147 A2 |   | 9/1999 |   |
| JP | 4-349198 |   | 12/1992 |   |
| JP | 4-349199 |   | 12/1992 |   |
| JP | 09315893 |   | 12/1997 |   |
| JP | 10279396 |   | 10/1998 |   |
| JP | 11130594 |   | 5/1999 |   |
| JP | 11228292 |   | 8/1999 |   |
| JP | 11292696 |   | 10/1999 |   |

OTHER PUBLICATIONS

The Electric Heaters Handbook (Omega Engineering, Inc., vol. 29, Stamford CT, pp. B–23–B–24, E–9, S–11–S–12, Z–55–Z–71, 1995).*

Brice, The Growth of Crystals from Liquids, American Elsevier Publishing Company, NewYork, pp. 175–178, 1973.*

(List continued on next page.)

Primary Examiner—Benjamin L. Utech
Assistant Examiner—Matthew Anderson
(74) Attorney, Agent, or Firm—Pearne & Gordon LLP

(57) ABSTRACT

A furnace for growing a high volume of crystals includes a plurality of individual growth stations and first and second heater matrixes. Each individual growth station has a crucible and an insulating container generally surrounding the crucible and thermally isolating the crucible from the other individual growth stations. The first and second heater matrices each include at least two legs electrically connected in parallel and each of the legs have at least two resistance heaters electrically connected in series. Each of the individual growth stations have at least one of the resistance heaters within the first heater matrix and at least one of the resistance heaters within the second heater matrix associated therewith. The resistance heaters of the first heater matrix are located above the crucibles and are preferably adapted to provide a homogeneous temperature across tops of the crucibles. The resistance heaters of the second heater matrix are preferably located below the crucible and are preferably adapted to provide a temperature gradient across bottoms of the crucibles.

20 Claims, 5 Drawing Sheets

U.S. PATENT DOCUMENTS

| | | | |
|---|---|---|---|
| 4,118,197 A | | 10/1978 | Mackintosh et al. |
| 4,126,757 A | * | 11/1978 | Smith et al. .................... 13/25 |
| 4,158,038 A | | 6/1979 | Jewett |
| 4,158,743 A | * | 6/1979 | Biolik et al. ................... 13/18 |
| 4,282,184 A | | 8/1981 | Fiegl et al. |
| 4,410,796 A | * | 10/1983 | Wilsey ....................... 219/553 |
| 4,435,819 A | | 3/1984 | Plume |
| 4,521,272 A | | 6/1985 | Gault ..................... 156/616 R |
| 4,549,345 A | * | 10/1985 | Wilsey ......................... 29/611 |
| 4,604,262 A | | 8/1986 | Nishizawa .................. 422/310 |
| 4,622,678 A | | 11/1986 | Scarfe |
| 4,654,110 A | | 3/1987 | Morrison .................... 156/607 |
| 4,659,421 A | | 4/1987 | Jewett ................... 156/617 SP |
| 4,813,470 A | | 3/1989 | Chiang |
| 5,087,429 A | | 2/1992 | Kamio et al. |
| 5,116,456 A | | 5/1992 | Nestor |
| 5,132,091 A | | 7/1992 | Azad |
| 5,137,699 A | * | 8/1992 | Azad .......................... 422/246 |
| 5,162,072 A | | 11/1992 | Azad |
| 5,260,037 A | | 11/1993 | Kitaura et al. .............. 422/249 |
| 5,268,558 A | | 12/1993 | Youssef et al. |
| 5,320,030 A | | 6/1994 | Hubbard |
| 5,343,022 A | | 8/1994 | Gilbert, Sr. et al. |
| 5,616,175 A | | 4/1997 | Walsh |
| 5,641,354 A | * | 6/1997 | Sakauchi et al. ........... 117/200 |
| 5,766,347 A | * | 6/1998 | Shimomura et al. ........ 117/217 |
| 5,780,820 A | | 7/1998 | Komyoji et al. |
| 5,824,149 A | | 10/1998 | Li |
| 5,851,500 A | | 12/1998 | Pashley ...................... 423/178 |
| 5,912,080 A | * | 6/1999 | Fiel et al. .................... 428/408 |
| 5,944,892 A | * | 8/1999 | Li .............................. 117/208 |
| 5,986,742 A | | 11/1999 | Straaijer et al. |
| 6,093,913 A | * | 7/2000 | Schrenker et al. .......... 219/424 |

OTHER PUBLICATIONS

"Norben Company, Inc." Located at http://www.norbencompany.com/about.htm, pp. 1–2.

SGL Carbon AG, "Sealings and Energy Technology—High Temperature Technology", Copyright © 1999, SGL Carbon AG., pp. 1–5, located at http://www.sglcarbon.com/te/tese004.html.

Series of Abstracts from SciFinder Scholar, "More Stuff for Chem Dept", May 16, 2000, pp. 2–23.

Series of Abstracts from SciFinder Scholar, "Even More Stuff for the Chem Dept", May 18, 2000, pp. 2–3, 5, 7, 10, 18, 20–22, 24, 27, 29 and 30.

Jeff Hecht, "All–Optical Networks Need Optical Switches", May 2000, pp. 189, 191–192, 194 and 196.

R. L. Parker, "Crystal Growth".

A. Horowitz, J. Makovsky and Y.S. Horowitz, "The Growth of Large Germanium Single Crystals by teh Thermal Gardient Method", Mat. Res. Bull., vol. 21, pp. 451–455, 1986.

David Turnbull and Morton B. Panish, "Crystal Growth", pp. 575–579.

A. Horowitz, S. Biderman, G. Ben Amar, U. Laor, M. Weiss and A. Stern, "The Growth of Single Crystals of Optical Materials via the Gardient Solidification Method", Journal of Crystal Growth 85 (1987), pp. 215–222, North–Holland, Amsterdam.

W.P. Allred, J.W. Burns and W.L. Hunter, "Synthesis of Indium Phosphide in a Pressure Balanced System", Journal of Crystal Growth 54 (1981), pp. 41–44, North–Holland Publishing Company.

A.C. Pastor and R.C. Pastor, "Crystal Growth of KC1 in a Reactive Atmosphere II: The Crystal Growth Technique", Mat. Res. Bull., vol. 19, pp. 1195–1199, 1984.

Donald C. Stockbarger, "Artificial Fluorite", Journal of The Optical Society of America, vol. 39, No. 9, pp. 731–740, Sep. 1949.

R.C. Pastor and K. Arita, "Crystal Growth of Alkaline Earth Fluorides in a Reactive Atmosphere. Part II*", Mat. Res. Bull. vol., 11, pp. 1037–1042, 1976.

R.C. Pastor and M. Robinson, "Crystal Growth of Alkaline Earth Fluorides in a Reactive Atmosphere. Part III*", Mat. Res. Bull. vol. 11, pp. 1327–1334, 1976.

R.C. Pastor, M. Robinson, and M. Braunstain, "Crystal Growth of Alkaline Earth Fluorides in a Reactive Atmosphere. Part IV*", Mat. Res. Bull., vol. 15, pp. 469–475, 1980.

W.P. Allred, J.W. Burns and W.L. Hunter, Synthesis of Indium Phophide in a Pressure Balanced System, Journal of Crystal Growth 54 (1981), pp. 41–44.

A. Horowitz, S. Biderman, G. Ben Amar, U. Laor, M. Weiss and A. Stern, The Growth of Single Crystals of Optical Materials via the Gradient Solidification Method, Journal of Crystal Growth 85 (1987), pp. 215–222.

A. Horowitz, J. Makovsky and Y.S. Horowitz, The Growth of Large Germanium Single Crystals by the Thermal Gradient Method, Mat. Res. Bull., vol. 21, pp. 451–455.

* cited by examiner

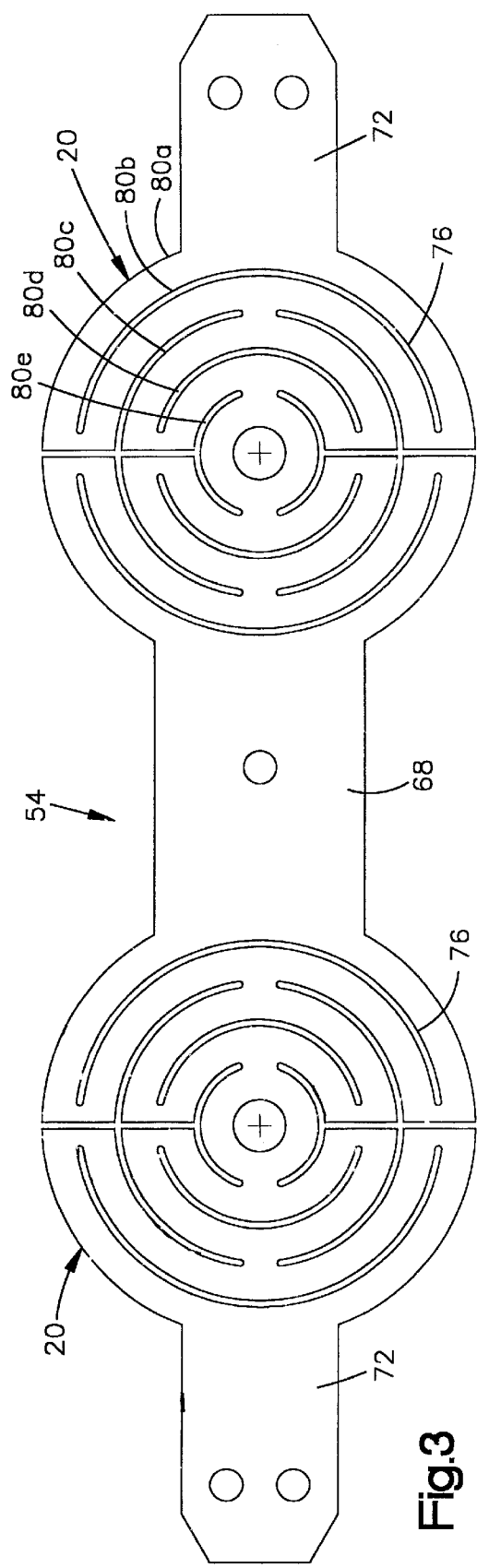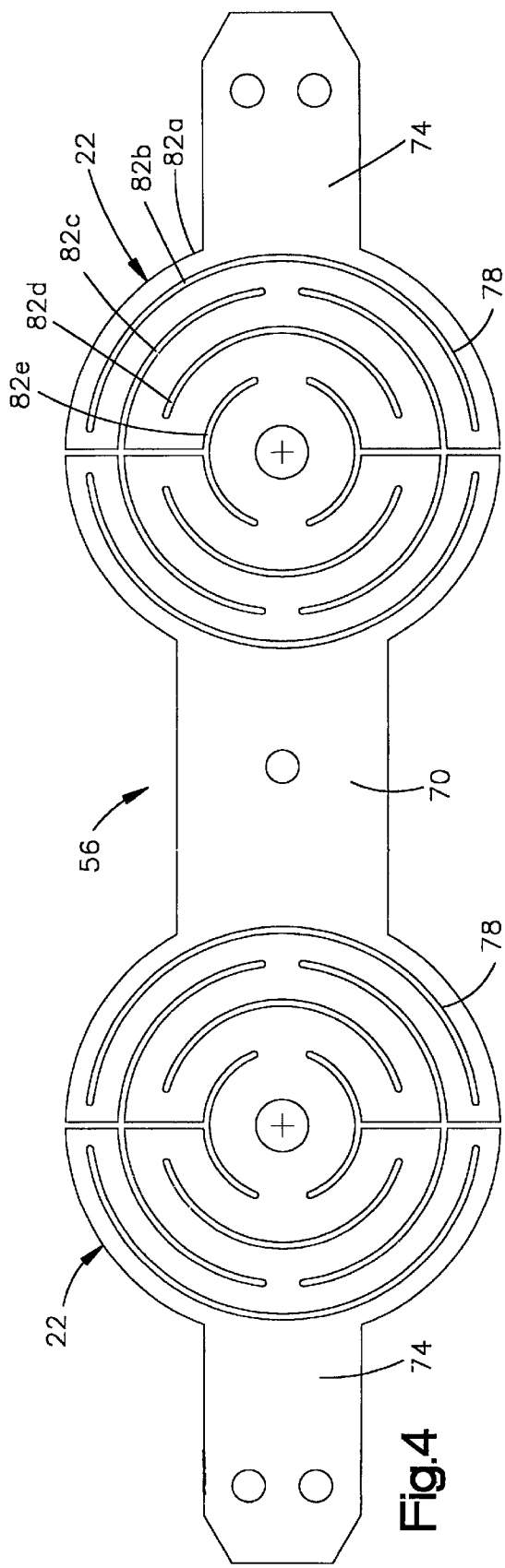

HEATER ARRANGEMENT FOR CRYSTAL GROWTH FURNACE

This application claims priority of U.S. provisional application Serial No. 60/141,389 filed on Jun. 29, 1999.

BACKGROUND OF THE INVENTION

The present invention generally relates to a heater arrangement for a furnace and, more specifically, to a heater arrangement for a crystal growth furnace suitable for producing a high volume of crystals.

Furnaces for the production of crystals, such as single crystals of calcium fluoride, typically have a crucible which is loaded with a seed and/or starting material. A heater (or heaters) is arranged about the crucible to produce a temperature gradient to grow the crystals in the crucible. Growth is obtained by varying power to the heater according to an established power-temperature relationship to obtain the desired thermal environment.

The thermal gradient obtained is critical to growing a single crystal rather than a polycrystalline structures. Additionally, the quality of a single crystal is believed to be primarily affected by the applied thermal gradient. Present furnaces for the production of macrocrystals, therefore, have elaborate and complex heaters and/or controllers for controlling the heaters to obtain the desired thermal environment. These complex devices are expensive to produce and complicated to operate and maintain.

In high volume production of crystals it is important to obtain the desired thermal environment and is also important to get consistent temperature environments. Accordingly, there is a need in the art for a crystal growth furnace which is simple to produce and operate, produces desired thermal environments for growing crystals, and produces consistent thermal environments for growing a high volume of crystals.

BRIEF SUMMARY OF THE INVENTION

The present invention provides a furnace for growing crystals which overcomes at least some of the above-noted problems of the prior art. According to the present invention, a heater arrangement for a crystal growth furnace includes a plurality of individual growth stations each having a crucible. The crystal growth furnace also includes a first heater matrix having at least two resistance heaters electrically connected in series or parallel. Each of the individual growth stations has at least one of the resistance heaters of the first heater matrix associated therewith and located near the crucible. By connecting the resistance heaters of separate growth stations in this manner, the temperatures produced by the resistance heaters in the separate growth stations are fixed at the same temperature for a given power level when the resistance heaters are connected to a single power source.

According to another aspect of the present invention, a heater arrangement for growing crystals includes a plurality of individual growth stations each having a crucible. The heater arrangement also includes a first heater matrix and a second heater matrix separate from the first heater matrix. Each heater matrix preferably includes at least two legs electrically connected in parallel with each of the legs having at least two resistance heaters electrically connected in series. Each of the individual growth stations has at least one of the resistance heaters of the first heater matrix and at least one of the resistance heaters of the second heater matrix associated therewith. By having two separate heater matrices, the temperatures produced by the resistance heaters in a large quantity of separate growth stations can be fixed at the same temperature for a given power level yet the temperature gradient formed in each of the growth stations can be varied when each heater matrix is connected to a separate power source. Preferably, the resistance heaters within the first heater matrix are located above the crucibles and provide a homogeneous temperature across the top of the crucibles and the resistance heaters within the second heater matrix are located below the crucibles and provide a temperature gradient across the bottom of the crucibles.

BRIEF DESCRIPTION OF THE SEVERAL VIEWS OF THE DRAWING

These and further features of the present invention will be apparent with reference to the following description and drawings, wherein:

FIG. 3 is a plan view of an upper resistance heater of the arrangement of FIG. 2;

FIG. 4 is a plan view of an lower resistance heater of the arrangement of FIG. 2;

DETAILED DESCRIPTION OF PREFERRED EMBODIMENTS

Figure 1:
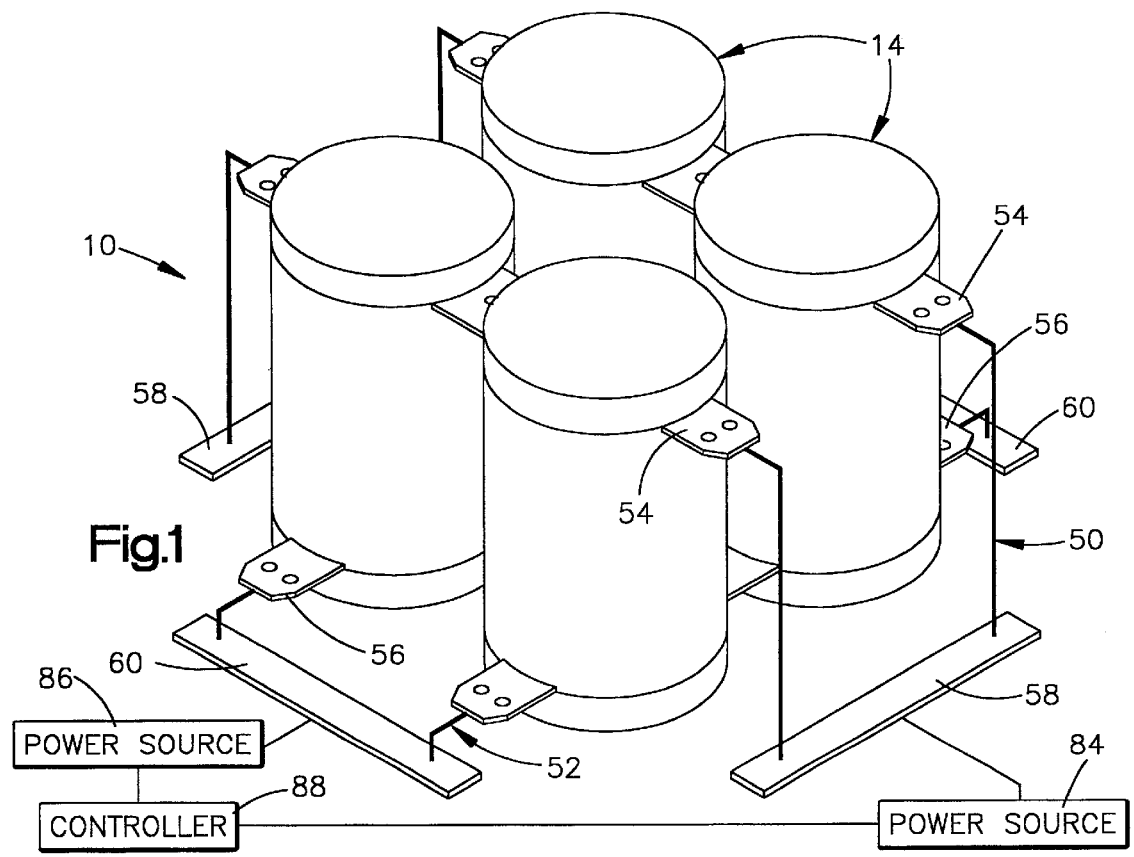
FIG. 1 is a perspective view of a crystal growth furnace having a plurality of individual growth stations for producing a high volume of macrocrystals according to the present invention and with components, such as a vacuum chamber, removed for clarity.

FIG. 1 illustrates a heat treatment or vacuum furnace 10 according to the present invention suitable for growing a high volume of crystals. The crystal growth furnace 10 can be used to grow low and high temperature crystals using, for example, melt, Vapor Phase Epitaxy (including VPE, MVPE and OMVPE), Chemical Vapor Deposition (CVD) and thin film processes. The crystal furnace 10 can be used to grow crystals of a variety of different materials such as calcium fluoride, sodium iodide, and cesium iodide etc. The crystal growth furnace 10 is particularly useful in growing single macrocrystals having diameters of, for example, up to about four feet and larger but can also be used to grow other types of crystals such as microcrystals or polycrystalline structures.

Figure 5:
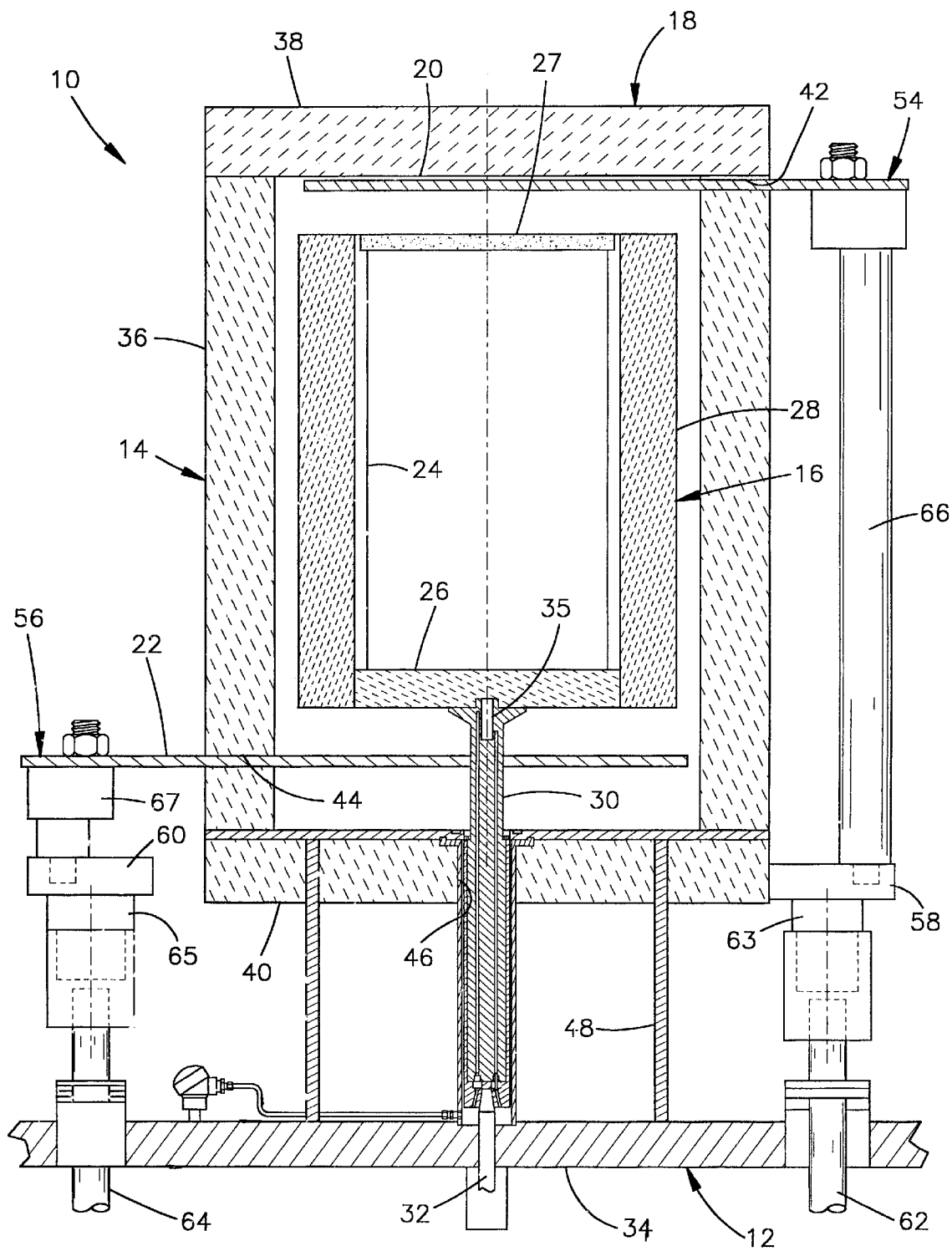
FIG. 5 is an enlarged elevational view, in cross-section, of one crucible of the crystal growth furnace of FIG. 1.

As best shown in FIGS. 1 and 5, the crystal growth furnace 10 includes a water-cooled pressure vessel or vacuum chamber 12 and a plurality of individual growth stations 14 located within the vacuum chamber 12. The vacuum chamber 12 preferably operates at a pressure of 10 millitorr or less. The dimensions of the vacuum chamber 12 depend on the size and number of individual growth stations 14 located therein. In the illustrated embodiment there are four individual growth stations but a greater or lesser number can be utilized as discussed in more detail hereinbelow.

Each individual growth station 14 includes a crucible 16 in which a crystal will grow, an insulating container or cylinder 18 surrounding the crucible 16, and two heaters 20, 22 located within the insulating cylinder 18 and adjacent the crucible 16. Preferably, a top heater 20 is located above the crucible 16 and a bottom heater 22 is located below the crucible 16. It is noted, however, that other heater locations such as around the sides of the crucible 18 are within the scope of the present invention.

The illustrated crucible 16 is cylindrical or cup-shaped having a side wall 24 and a bottom wall 26. The crucible 16 is formed of a suitable material such as, for example, graphite, carbon, or other carbon composites. The dimensions of the crucible 16 depend on the desired size of the crystal to be grown therein. A crucible believed suitable for growing single crystals of calcium fluoride has an outer diameter of about 5.5 inches, an outer height of about 12 inches, an inner diameter of about 4 inches, and an inner height of about 10.75 inches. Suitable ranges for the crucible dimensions are believed to be an outer diameter of from about 2 inches to about 40 inches, an outer height of from about 6 inches to about 40 inches, an inner diameter of from about 1 inch to about 38 inches, and an inner height of from about 3 inches to about 36 inches.

The top opening of the crucible 16 is closed by a lid or cover 27. The lid 27 is formed of a suitable material such as graphite or carbon composite.

The perimeter of the crucible 16 is provided with suitable insulation 28. The insulation 28 comprises a suitable material such as rigidized carbon felt or rigidized carbon foam. The inner surface of the insulation 28 preferably has a thin layer of graphite foil or GRAFOIL for increased reflection of the radiation. This thin layer of graphite foil preferably has a thickness in the range of about 1/32 inch to about 1/8 inch. The insulation 28 preferably extends the entire height of the crucible 16 from the top to the bottom of the side wall 24. The insulation 28 preferably extends about 1 to 6 inches from the outer diameter of the crucible side wall 24 but not beyond the outer diameter of the top and bottom heaters 20, 22. Insulation having a thickness of about 1.5 inches is believed suitable for the above described crucible for growing single crystals of calcium fluoride but it may be thicker or thinner depending on the insulation heat transfer characteristics. It is noted that the insulation 28 is located at other locations about the crucible 16 when the heaters 20, 22 heaters have other locations.

The crucible 16 is supported by a pedestal 30 downwardly extending from the bottom wall 26, through the bottom heater 22, and rests in a cup or adapter. The cup rests on a shaft 32 which extends through the base plate or bottom wall 34 of the vacuum chamber 12. The pedestal 30 is formed of a suitable material such as, for example, graphite or carbon composite while the cup is formed of a suitable material such as steel or inconel, and the shaft 32 is formed of a suitable material such, for example, as stainless steel or inconel. The pedestal 30 extends into or otherwise supports the bottom wall 26 of the crucible 16 and is preferably provided with an upward facing recess or pocket 35 for holding a seed or starting material. A pocket having a diameter of about 7/16 inches, a length of about 1.5 inches and extending into the crucible about 1 inch is believed suitable for the above described crucible to receive starting material for growing single crystals of calcium fluoride. The seed pocket diameters described above are for crystals having diameters up to about 13 inches, crystals having larger diameters should have seeds greater than about 1 inch in diameter.

The insulating cylinder 18 is adapted to generally surround the crucible 16 and the top and bottom heaters 20, 22 so that the top and bottom heaters 20, 22 are insulated from the top and bottom heaters 20, 22 of the other individual growth stations 14 so that each of the individual growth stations 14 will be thermally independent of the others. The illustrated insulating cylinder 18 has a cylindrically-shaped side wall 36, a top wall 38 generally closing the open upper end of the side wall 36, and a bottom wall 40 generally closing the 14 lower open end of the side wall 36. The side, top, and bottom walls 36, 38, 40 comprise suitable insulation material such as rigidized carbon felt or rigidized carbon foam. The insulation material is preferably suitable for maintaining a temperature difference of about 1000° C. to about 1300° C. The side wall 36 is sized so that the top and bottom heaters 20, 22 can reside within the inner diameter of the side wall 36 and is provided with suitable openings 42, 44 for the passage of the top and bottom heaters 20, 22 therethrough. The surface of the inner diameter of the insulating cylinder 18 preferably has a thin layer of graphite foil or GRAFOIL for increased reflection of the radiation and reduced radiation losses. This layer of graphite foil is also preferably located on the inner surfaces of the top and bottom walls 38, 40. This layer preferably has a thickness in the range of about 1/32 inch to about 1/8 inch. An insulating cylinder having wall thicknesses of about 2 inches, an inner diameter of about 9 inches, and an interior height of about 16 inches is believed suitable for the above described crucible for growing single crystals of calcium fluoride. Suitable ranges for the insulating cylinder dimensions are believed to be wall thicknesses of from about 2 inches to about 4 inches, an inner diameter of from about 4 inches to about 72 inches, and an interior height of from about 6 inches to about 48 inches.

The bottom wall 40 of the insulating cylinder 18 is provided with a suitable opening 46 for passage of the pedestal 30 therethrough. Preferably, a base 48 is provided which supports the side, top and bottom walls 36, 38, 40 and positions the walls 36, 38, 40 about the crucible 16 and the top and bottom heaters 20, 22.

Figure 2:
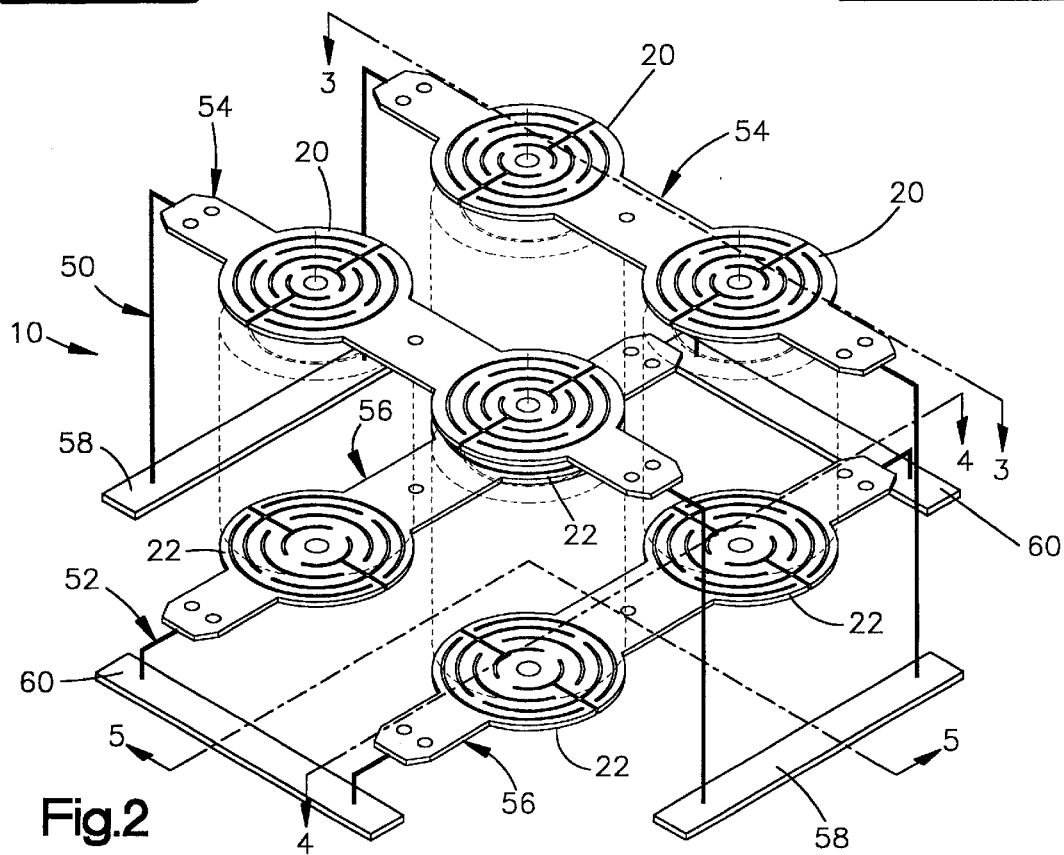
FIG. 2 is a perspective view of the crystal growth furnace of FIG. 1 with further components, such as crucibles, removed for clarity to show a heater matrix.

As best shown in FIG. 2, the top heaters 20 of the individual growth stations 14 are suitably connected to form a top or first heater matrix 50 and the bottom heaters 22 of the individual growth stations 14 are suitably connected to form a bottom or second heater matrix 52. Each heater matrix 50, 52 includes at least one leg 54, 56 of two or more of the heaters 20, 22 connected in series or at least two heater legs 54, 56 which are connected in parallel. Preferably, each heater matrix 50, 52 includes at least two heater legs 54, 56 with each heater leg 54, 56 having at least two heaters 20, 22. The illustrated heater matrices 50, 52 each have two heater legs 54, 56 of two heaters 20, 22 to accommodate the four individual growth stations 14. As noted hereinabove, the number of heater legs 54, 56 and the number of heaters 20, 22 in each heater leg 54, 56 can be greater or lesser depending on the number of individual growth stations 14 desired. Moreover, each heater matrix 50, 52 may be two or more heaters 20, 22 only connected in series, only connected in parallel, or a combination of both.

Power is distributed to the heater matrices 50, 52 by way of bus bars 58, 60. Preferably, the bus bars 58, 60 are all located at the same height near the bottom of the individual growth stations 14. The bus bars 58, 60 are formed of a suitable material such as, for example, graphite or carbon composite. Each heater matrix 50, 52 has a separate pair of the bus bars 58, 60 wherein all of the heater legs 54, 56 of the heater matrix 50, 52 are suitably connected in parallel between the pair of bus bars 58, 60.

As best shown in FIG. 5, the heater legs 54, 56 are connected to the bus bars 58, 60 and the bus bars 58, 60 are connected to copper feed-through electrodes 62, 64 which extend through the bottom wall 34 of the vacuum chamber 12. The bus bars 58, 60 are preferably connected to the copper feed-through electrodes 62, 64 via graphite electrodes 63, 65. Graphite bus bars having a height of about 1 inch, a width of about 4 inches, and a length of about 16 inches are believed to be suitable for a four station furnace having a heater matrix with two legs of two heaters each and the above described crucibles for growing single crystals of calcium fluoride. Suitable ranges for the bus bars are believed to be a height of from about 1 inch to about 5 inches, a width of from about 1 inch to about 5 inches, and a length of from about 6 inches to about 500 inches.

The heater legs 54, 56 are positioned above and below the crucibles 16 and pass through the insulating cylinders 18 via the openings 42, 44. The top heater leg 54 is positioned between and spaced apart from the lid 27 of the crucible 16 and the top wall 38 of the insulating cylinder 18. The bottom heater leg 56 is positioned between and spaced apart from the bottom wall 26 of the crucible 16 and the bottom wall 40 of the insulating cylinder 18. Spacings of about 0.75 inches from the lid 27 of the crucible 16, about 0.5 inches from the top wall 38 of the insulating cylinder 18, about 1.25 inches from the bottom wall 26 of the crucible 16, and about 0.75 inches from the bottom wall 40 of the insulating cylinder 18 are suitable with the above described crucibles for growing single crystals of calcium fluoride. Suitable ranges for the spacings are believed to be from about 0.25 inches to about 1 inch for the distance from the lid 27 of the crucible 16, from about 0.5 inches to about 3 inches for the distance from the top wall 38 of the insulating cylinder 18, from about 0.25 inches to about 1 inch for the distance from the bottom wall 26 of the crucible 16, and from about 0.5 inches to about 3 inches from the bottom wall 40 of the insulating cylinder 18.

In the illustrated embodiment, vertically extending supports or posts 66, 67 are provided between the heater legs 54, 56 and the bus bars 58, 60 at the ends of the heater legs 54, 56. The posts 66, 67 both support the heater legs 54, 56 and electrically connect the heater legs 54 to the bus bars 58, 60. It is noted that the heater legs 54, 56 are preferably self supporting between the posts 66, 67 at the ends of the heater legs 54, 56 but, if necessary, intermediate posts can be utilized. The posts 66, 67 are formed of a suitable material such as, for example, graphite or carbon composite.

The posts 66, 67 are sized to position the heater legs 54, 56 above and below the crucible 16 respectively at their desired heights. A top heater post 66 having a upper portion diameter of about 2 inches, an upper portion length of about 1.5 inches, a lower portion diameter of about 1.5 inches, and a lower portion length of about 15.5 inches is believed to be suitable for a four station furnace having a heater matrix with two legs of two heaters each and the above described crucibles for growing single crystals of calcium fluoride. Suitable ranges for the dimensions of the top heater post 66 are believed to be an upper portion diameter of from about 2 inches to about 6 inches, an upper portion length of from about 1 inch to about 3 inches, a lower portion diameter of from about 1 inch to about 3 inches, and a lower portion length of from about 6 inches to about 20 inches. A bottom heater post 67 having a upper portion diameter of about 2 inches, an upper portion length of about 1.5 inches, a lower portion diameter of about 1.5 inches, and a lower portion length of about 1.25 inches is believed to be suitable for a four station furnace having a heater matrix with two legs of two heaters each and the above described crucibles for growing single crystals of calcium fluoride. Suitable ranges for the dimensions of the bottom heater post 67 are believed to be an upper portion diameter of from about 2 inches to about 6 inches, an upper portion length of from about 1 inch to about 3 inches, a lower portion diameter of from about 1 inch to about 3 inches, and a lower portion length of from about 3 inches to about 12 inches.

As best shown in FIGS. 3 and 4, the heaters 20, 22 and heater legs 54, 56 are electric resistance heaters and are preferably formed from a single sheet or bar of material. The heater legs 54, 56 preferably comprise graphite or other suitable materials such as, for example, a carbon—carbon composite, a polycarbon composite, or silicon carbide.

In the illustrated embodiment each heater leg 54, 56 has two of the heaters 20, 22 formed therein. Each heater leg preferably has a central portion 68, 70 connecting the heaters 20, 22 and end portions 72, 74 extending from opposite sides of the heaters 20, 22. The end portions 72, 74 are adapted to be connected to the bus bars 58, 60 such as, for example, providing openings for the passage of fasteners therethrough. It is noted that additional or fewer heaters 20, 22 can be formed in a single heater leg 54, 56 as discussed in more detail hereinafter. Graphite heater legs 54, 56 having a thickness of about 5 mm, a total length of about 29.5 inches, heater outer diameters of about 8.25 inches, a central portion length of about 4⅝ inches, end portion lengths of about 4⅛ inches, and central and end portion widths of about 3 to about 5 inches are believed to be suitable for a four station furnace having a heater matrix with two legs of two heaters each and the above described crucibles for growing single crystals of calcium fluoride. Suitable ranges for the dimensions of the heater legs 54, 56 are believed to be a thickness of from about 2 mm to about 18 mm, a total length of from about 8 inches to about 108 inches, heater outer diameters of from about 6 inches to about 40 inches, a central portion length of from about 4 inches to about 10 inches, end portion lengths of from about 4 inches to about 8 inches, and central and end portion widths of from about 2 inches to about 6 inches.

Each heater 20, 22 preferably has body with a generally circular outer periphery and a constant thickness. The body is provided with gaps or slots 76, 78 which produce a "zig-zag" circuit of current flow paths. The flow paths are preferably formed by arcuate or curved circumferentially extending sections 80, 82 connected at their ends. In the illustrated embodiment, there are five sections 80, 82 but a greater or lesser number of sections 80, 82 can be utilized. A first half of the body has two separate current flow paths which extend from the first or outermost section 80a, 82a to the fifth or innermost section 80e, 82e and a second half of the body two separate current flow paths which extend from the innermost section 80a, 82a to the outermost section 80e, 82e. Note that the first and second halves of the body are isolated from one another except at the fifth or inner most section 80a, 82a. Preferably, the two current flow paths are connected along their lengths at intermediate points between the innermost section 80a, 82a to the outermost section 80e, 82e. The current flow paths of illustrated embodiment are connected at the junction between the second sections 80b, 82b and the third sections 80c, 82c and at the junction between the fourth sections 80d, 82d and the fifth sections 80e, 82e.

The heaters 20, 22 within each heater matrix 50, 52 can be the same or different depending on the needs of the crystal growth furnace 10. Each of the heaters 20, 22 within a heater matrix 50, 52 can be the same, that is, have the same resistance such that for any given amperage/voltage, the temperature will be the same at the individual growth stations 14. The heaters 20, 22 within a heater matrix 50, 52 can alternatively each have a different resistance such that for any given amperage/voltage, the temperature will be higher or lower at the various individual growth stations 14. In the illustrated embodiment, each of the top heaters 20 within the top heater matrix 50 are the same and each of the bottom heaters 22 within the bottom heater matrix 52 are the same.

Likewise, the top and bottom heaters 20, 22 of each individual growth station 14 can be the same or different depending on the needs of the growth stations 14. In the illustrated embodiment, the top and bottom heaters 20 within each growth station 14 are different.

As best shown in FIG. 3, each top heater 20 is designed to provide, at any given amperage/voltage, a homogeneous thermal environment across the top of the crucible 16. Accordingly, the sections 80a–80e each have substantially the same width. The dimensions of the top heater 20 depend on the thermal environment desired and the amperage/voltage desired to be supplied. A graphite top heater having a thickness of about 5 mm, an outer diameter of about 8.25 inches, an inner diameter of about 1 inch, gap widths of about 1/8 inch, and section widths of about 5/8 inch is believed to be suitable for the above described crucibles for growing single crystals of calcium fluoride. Such top heaters preferably operate with total power of about 20 kw (for two legs of two heaters) and have a total resistance of about 0.0508 ohms (for two legs of two heaters), therefore there is about 627 amps and 32 volts secondary (going to the bus) and about 85 amps and 240 volts primary (going to the transformer (step down factor of 2.5)). Other dimensions, resistances, and power will be obvious to one skilled in the art to obtain desired thermal environments.

As best shown in FIG. 4, each bottom heater 22 is designed to provide, at any given amperage/voltage, a radial thermal gradient across the bottom of the crucible, that is, a thermal environment with an increasing temperature in the radial direction, from the center of the crucible 16 to the outer periphery of the crucible 16. The innermost section 82e of the heater 22 is the coldest section and the temperature of each of the sections 82a–82e gradually increases to the outermost section 82a which is the hottest section. This temperature gradient ensures that the origin of the crystal growth will be at one position within the crucible 16 and that location is at the central axis of the crucible 16.

The dimensions of the bottom heater 22 depend on the thermal environment desired and the amperage/voltage desired to be supplied. A graphite bottom heater having a thickness of about 5 mm, an outer diameter of about 8.25 inches, an inner diameter of about 1 inch, gap widths of about 1/8 inch, and increasing section widths of about 3/8 inch, about 4/8 inch, about 5/8 inch, about 6/8 inch, and about 7/8 inch is believed to be suitable for the above described crucibles for growing single crystals of calcium fluoride. Such bottom heaters preferably operate with total power of about 20 kw (for two legs of two heaters) and have a total resistance of about 0.06895 ohms (for two legs of two heaters), therefore there is about 540 amps and 37 volts secondary (going to the bus) and about 83 amps and 240 volts primary (going to the transformer (step down factor of 2.5)). Other dimensions, resistances, and power will be obvious to one skilled in the art to obtain desired thermal environments.

As best shown in FIG. 1, the heaters 20, 22 of each heater matrix 50, 52 are connected to a single power source 84, 86 so that at any given power level, the temperature of all the heaters 20, 22 within the heater matrix 50, 52 are fixed and may or may not be the same through out the heater matrix 50, 52 depending on the individual design of the heaters 20, 22. Preferably, the heater matrices 50, 52 each have a separate power source 84, 86. A first power source 84 controls the upper heater matrix 50 and a second power source 86 controls the lower heater matrix 52 so that the temperature of the heater matrices 50, 52 relative to each other can be varied. The separate power sources 84, 86 of the heater matrices 50, 52 are preferably controlled by a single controller 88. The power sources 84, 86 and the controller 88 can be conventional.

Figure 6:
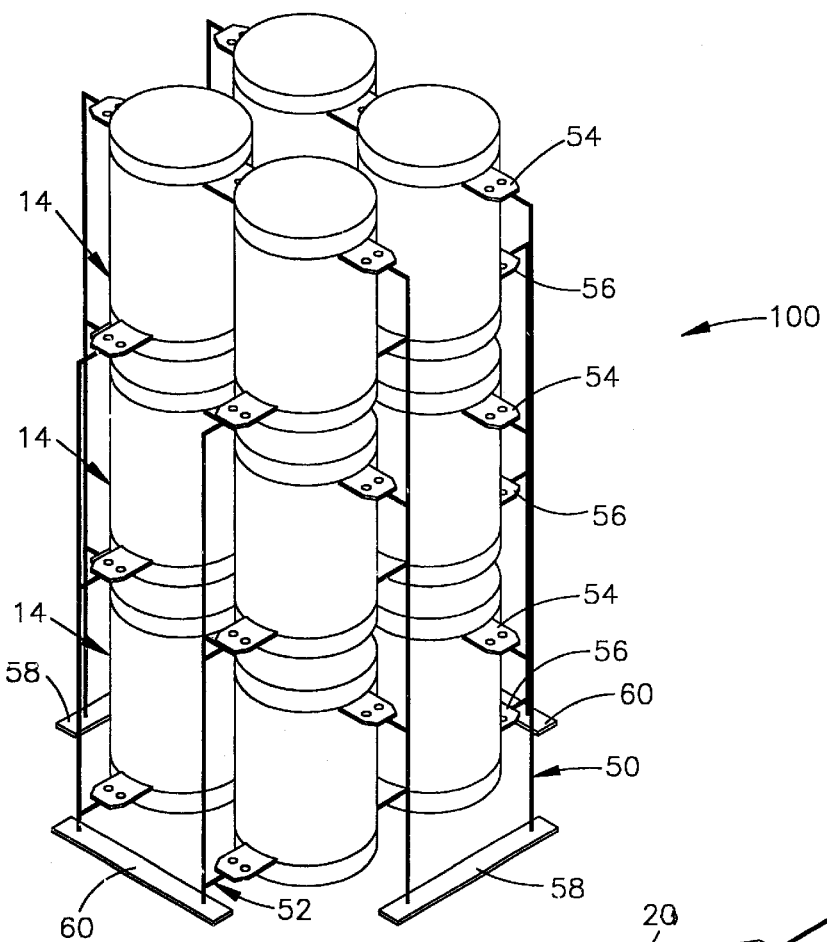
FIG. 6 is a perspective view of a crystal growth furnace having a plurality of individual growth stations for producing a high volume of macrocrystals according to a second embodiment of the present invention with components, such as a vacuum chamber, removed for clarity.

FIG. 6 illustrates a heat treatment or vacuum furnace 100 according to a second embodiment of the present invention wherein like reference numbers are used for like structure. The crystal growth furnace 100 illustrates that additional levels or layers of individual growth stations 14 can be utilized. In the illustrated embodiment there are three levels of four individual growth stations 14 so that the crystal growth furnace 100 has twelve individual growth stations 14. Each heater matrix 50, 52 includes six heater legs 54, 56 connected in parallel with each leg having two heater 20, 22 to accommodate the twelve individual growth stations 14. While the illustrated embodiment has three levels, it is noted that a greater or lesser number of layers can be utilized. It is also noted that the features of the second embodiment can be utilized alone or in combination with each of the features of each of the other disclosed embodiments.

Figure 7:
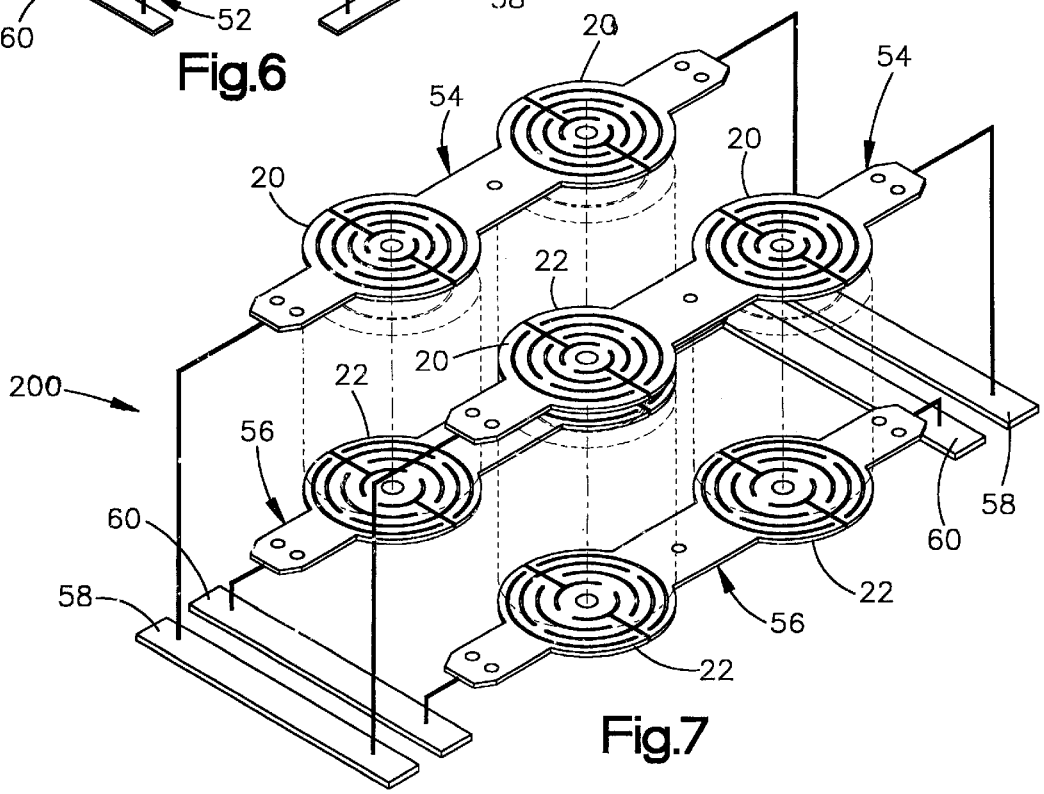
FIG. 7 is a perspective view of a crystal growth furnace having a plurality of individual growth stations for producing a high volume of macrocrystals according to a third embodiment of the present invention with components, such as a vacuum chamber and crucibles, removed for clarity to show a heater matrix.

FIG. 7 illustrates a heat treatment or vacuum furnace 200 according to a third embodiment of the present invention wherein like reference numbers are used for like structure. The crystal growth furnace 200 illustrates that the top heater legs 54 can extend parallel to the bottom heater legs 56 rather than perpendicular as in the first embodiment. Accordingly, the bus bars 58, 60 are parallel on one side rather than perpendicular on different sides as in the first embodiment. In this embodiment the top heater legs 54 have a larger length than the bottom heater legs 56. It is also noted that the features of the third embodiment can be utilized alone or in combination with each of the features of each of the other disclosed embodiments.

Figure 8:
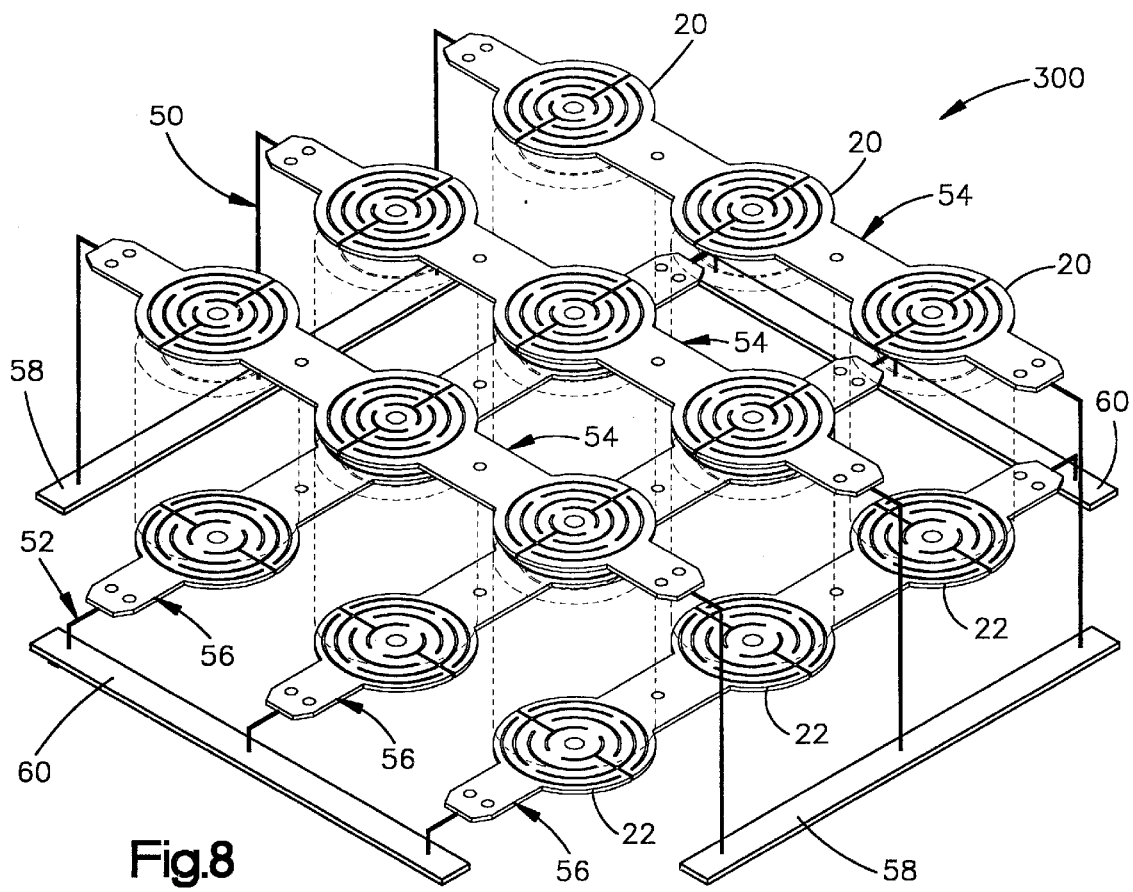
FIG. 8 is a perspective view of a crystal growth furnace having a plurality of individual growth stations for producing a high volume of macrocrystals according to a fourth embodiment of the present invention with components, such as a vacuum chamber and crucibles, removed for clarity to show a heater arrangement.

FIG. 8 illustrates a heat treatment or vacuum furnace 300 according to a fourth embodiment of the present invention wherein like reference numbers are used for like structure. The crystal growth furnace 300 illustrates that there can be additional heater legs 54, 56 and that the heater legs 54, 56 can have addition heaters 20, 22. In the illustrated embodiment, there are three heater legs 54, 56 each having three heaters 20, 22 so that the crystal growth furnace 300 has one level of nine individual growth stations 14. While the illustrated embodiment has one level, three heater legs 54, 56, and three heaters 20, 22 in each heater leg 54, 56, it is noted that a greater number of layers can be utilized a greater or lesser number of heater legs 54, 56 in each layer can be utilized, and a greater of lesser number of heaters 20, 22 in each heater leg 54, 56 can be utilized. It is also noted that the features of the fourth embodiment can be utilized alone or in combination with each of the features of each of the other disclosed embodiments.

It is noted that the fourth embodiment can be particularly advantageous wherein the heaters 20, 22 are different within the heater matrices 50, 52 to form different thermal environments on different individual growth stations 14. This allows the furnace to be utilized to grow crystals using a continuous process technique. In the continuous process technique, material is loaded into containers at one end of the crystal growth furnace 300 and the material passes through a number of individual growth stations 14 having different thermal gradients. For example, the material can pass through individual growth stations 14 which are adapted to separately heat up starting material, grow the crystal, and cool down the crystal to room temperature.

Figure 9:
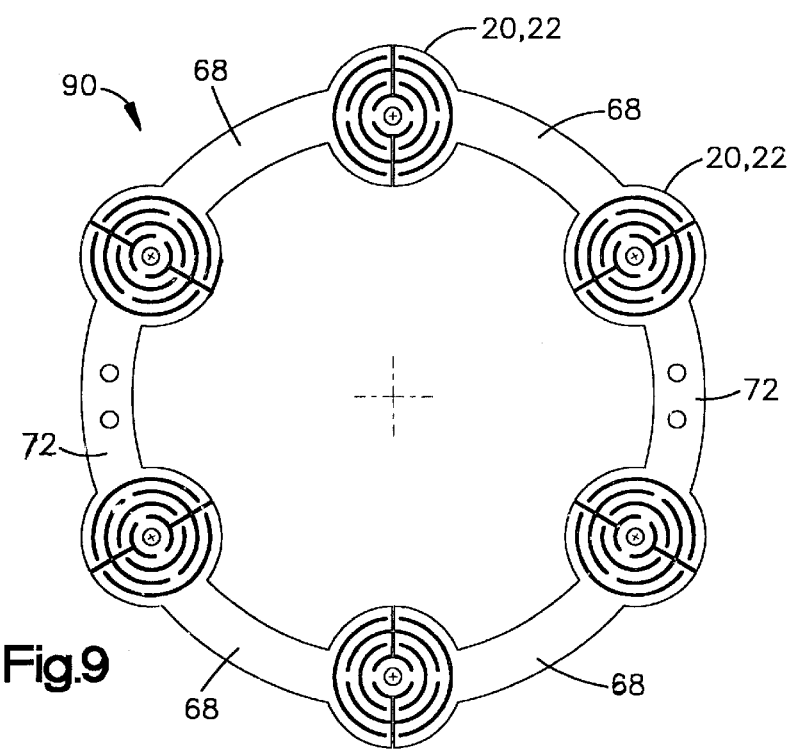
FIG. 9 is a plan view similar to FIGS. 3 and 4 but showing an alternative heater leg.

FIG. 9 illustrates an alternative heater leg 90 wherein like reference numbers are used for like structure. The heater leg 90 illustrates that the heater legs can have shapes other than the above described linear configuration (FIGS. 3 and 4), such as the illustrated circular configuration. In the illustrated embodiment, the heater leg 90 is generally circular and has six of the heaters 20, 22 incorporated therein. It is noted that a greater or lesser quantity of the heaters 20, 22 can be utilized and the heaters 20, 22 can have different locations than illustrated. It is also noted that the alternative heater legs 90 can be utilized alone or in combination with each of the disclosed embodiments. The circular arrangement of the heater leg 90 can be particularly advantageous when a plurality of circular heater legs 90 of various diameters are coaxially arranged.

Although particular embodiments of the invention have been described in detail, it will be understood that the invention is not limited correspondingly in scope, but includes all changes and modifications coming within the spirit and terms of the claims appended hereto.

What is claimed is:

1. A crystal growth furnace having multiple crystal growing stations comprising:
    a crucible at each growth station adapted to grow crystals therein;
    insulation on each crucible to insulate it thermally from another growth station;
    a power source;
    a first heater matrix having at least one matrix leg, each matrix leg including at least two resistance heaters, each of the heaters having a first end and a second end, the first end of one of the heaters electrically connected to the power source, and said one of said resistance heaters electrically connected to the other resistance heater in series so that electrical interconnections between said two resistance heaters in the first heater matrix are adapted to transmit power simultaneously, at any given time, to all the resistance heaters in the first heater matrix;
    each crucible in each growth station having at least one of the resistance heaters associated therewith so that each crucible is heated by a resistance heater; and
    the power source being adapted for powering said two resistance heaters simultaneously, at any given time, whereby the crystal growth furnace is adapted to grow crystals uniformly and simultaneously at each growing station.

2. The crystal growth furnace according to claim 1, wherein said resistance heaters are located below said crucibles.

3. The crystal growth furnace according to claim 2, wherein said resistance heaters comprise graphite sheets having slots to define electrical arc-shaped flow paths having resistances for obtaining thermal gradients, said flow paths having cross-sections of varying size to obtain a thermal gradient which is cooler towards the center and warmer radially outwardly thereby causing crystals to grow from the center outwardly.

4. The crystal growth furnace according to claim 3, which further includes a second heater matrix including at least two resistance heaters, at least one of said heaters being above each of said crucibles, said resistance heaters being connected in series or parallel.

5. The crystal growth furnace according to claim 4, wherein said resistance heaters in said second matrix are adapted to provide a homogeneous thermal environment across tops of said crucibles.

6. The crystal growth furnace according to claim 5, wherein said resistance heaters in said second matrix comprise graphite sheets having slots to define arcuate electrical flow paths having resistances for obtaining thermal environments, said flow paths having cross-sections of generally constant size to obtain a homogeneous thermal environment.

7. The crystal growth furnace according to claim 4, wherein said individual growing stations each have an insulating container generally surrounding said crucible, and a single thermal chamber enclosing all the growing stations in order to have substantially the same environment and temperature around each container.

8. The crystal growth furnace according to claim 1, wherein said first heater matrix includes at least two legs of at least two of said resistance heaters electrically connected in series and said legs are electrically connected in parallel, each resistance heater in said first matrix being located below a crucible.

9. The crystal growth furnace according to claim 8, wherein all of said resistance heaters in the first matrix comprise graphite sheets having slots to define arcuate electrical flow paths, the flow paths having cross-sections going from larger to smaller from the center radially outwardly so that a gradient is created from cooler to hotter from the center outwardly and thereby causing crystal formation from the center radially outwardly.

10. The crystal growth furnace according to claim 9, wherein said second heater matrix includes at least two legs of at least two of said resistance heaters electrically connected in series and said legs are electrically connected in parallel.

11. The crystal growth furnace according to claim 10, further comprising a second power source connected to the second heater matrix.

12. A crystal growth furnace having multiple crystal growing stations comprising:
    a crucible at each growing station adapted to grow crystals therein;
    a first power source;
    a first heater matrix including at least two legs, each matrix leg having a first end and a second end, each of the first ends of the matrix legs electrically connected to the first power source, each of the second ends of the matrix legs electrically connected together, thereby causing the matrix legs to be electrically connected in parallel, each of said legs having at least two resistance heaters, each of the heaters having a first end and a second end, the first end of one of the heaters electrically connected to the first power source, the second end of said one heater electrically connected to the first end of a second one of the heaters, thereby causing the heaters to be electrically connected in series so that electrical interconnections between the resistance heaters in the first heater matrix are adapted to transmit power simultaneously, at any given instance, to all the resistance heaters in the first heater matrix, each of said individual growing stations having at least one of said resistance heaters of said first heater matrix associated therewith and located near said crucible;

a second power source;

a second heater matrix including at least two legs, each matrix leg having a first end and a second end, each of the first ends of the matrix legs electrically connected to the second power source, each of the second ends of the matrix legs electrically connected together, thereby causing the matrix legs to be electrically connected in parallel, each of said legs having at least two resistance heaters, each of the heaters having a first end and a second end, the first end of one of the heaters electrically connected to the second power source, the second end of said one heater electrically connected to the first end of a second one of the heaters, thereby causing the heaters to be electrically connected in series so that electrical interconnections between the resistance heaters in the second matrix are adapted to transmit power simultaneously, at any given time, to the resistance heaters in the second heater matrix, wherein said second heater matrix is separate from said first heater matrix and each of said individual growing stations has at least one of said resistance heaters of said second heater matrix associated therewith and located near said crucible;

the first power source adapted for transmitting power to all of the resistance heaters connected to the first heater matrix simultaneously, at any given time; and the second power source adapted for transmitting power to all of the resistance heaters connected to the second heater matrix simultaneously, at any given time, whereby the crystal growth furnace is adapted to grow crystals uniformly and simultaneously at each growth station.

13. The crystal growth furnace according to claim 12, wherein said resistance heaters of said first heater matrix is located below said crucibles and are adapted to provide a thermal gradient across bottoms of said crucibles.

14. The crystal growth furnace according to claim 13, wherein said resistance heaters of said first heater matrix comprise graphite sheets having slots to define arcuate electrical flow paths having resistances for obtaining thermal environments, said flow paths having cross-sections of varying size from larger to smaller to create a temperature gradient from cooler to hotter from the center radially outwardly whereby crystals grow from the center outwardly.

15. The crystal growth furnace according to claim 14, wherein said resistance heaters of said second heater matrix are adapted to provide a homogeneous thermal environment across tops of said crucibles.

16. The crystal growth furnace according to claim 14, wherein said resistance heaters in said second matrix comprise graphite sheets having slots to define electrical flow paths having resistances for obtaining thermal environments, said flow paths having cross-sections of generally constant cross section to obtain said homogeneous thermal environment.

17. The crystal growth furnace according to claim 16, wherein said first and second heater matrices are adapted to provide different thermal environments for said individual growing stations.

18. The crystal growth furnace according to claim 16, wherein all of the resistance heaters in the first matrix are substantially the same and all of the resistance heaters in the second matrix are substantially the same so that all growth stations are heated and cooled to the same temperature at the same time.

19. The crystal growth furnace according to claim 18, further comprising separate first and second power sources connected to said first and second heater matrices respectively.

20. The crystal growth furnace according to claim 18, further comprising a single thermal chamber covering all of the growing stations in order to provide a uniform thermal environment whereby the crystal growing stations may grow more uniform crystals simultaneously at each growing station.

* * * * *